(12) United States Patent
MacDonald et al.

(10) Patent No.: US 6,538,196 B1
(45) Date of Patent: Mar. 25, 2003

(54) ELECTRIC MODULE STRUCTURE FORMED WITH A POLYMER SHRUNK MATERIAL

(75) Inventors: James D. MacDonald, Apex, NC (US); Walter Marcinkiewicz, Apex, NC (US); Gregory S. Mendolia, Forest, VA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/429,333

(22) Filed: Oct. 28, 1999

(51) Int. Cl.[7] ................................................. H05K 9/00
(52) U.S. Cl. ............................... 174/35 GC; 174/35 R
(58) Field of Search ........................ 174/35 R, 35 MS, 174/DIG. 8; 361/816, 818, 752, 753

(56) References Cited

U.S. PATENT DOCUMENTS

| 4,223,177 | A |   | 9/1980 | Nakamura ................. 174/52.3 |
| 4,450,871 | A | * | 5/1984 | Sato et al. .................. 138/140 |
| 4,658,334 | A | * | 4/1987 | McSparran et al. ......... 361/800 |
| 4,858,075 | A |   | 8/1989 | Butterworth ................ 361/739 |
| 5,031,076 | A |   | 7/1991 | Kiku .......................... 361/816 |
| 5,353,350 | A |   | 10/1994 | Unsworth et al. ............. 380/3 |
| 5,717,577 | A | * | 2/1998 | Mendolia et al. ........... 361/818 |
| 5,739,463 | A |   | 4/1998 | Diaz et al. ................. 174/35 R |
| 6,134,121 | A | * | 10/2000 | Braxton ...................... 361/818 |
| 6,178,318 | B1 | * | 1/2001 | Holmberg et al. .......... 455/300 |

FOREIGN PATENT DOCUMENTS

| EP |   | 0742683 A1 |   | 11/1996 |   |
| JP |   | 402071595 A | * | 3/1990 | .............. 174/35 R |
| WO |   | WO 98/37742 |   | 8/1998 |   |

\* cited by examiner

Primary Examiner—Hung V. Ngo
(74) Attorney, Agent, or Firm—Coats & Bennett, P.L.L.C.

(57) ABSTRACT

A microelectric module including a circuit substrate having one or more covers or electromagnetic shields disposed thereon. To secure the covers or electromagnetic shields to the circuit substrate, and provide an electrical contact with an underlying ground pattern, a thin plastic film is extended over the covers or electromagnetic shields and the circuit substrate. This film is subjected to heat, causing it to shrink and effectively provide a controlled force that acts to hold and lock the covers or electromagnetic shields to the circuit substrate. Thus the heat-shrunk film mechanically secures the covers or electromagnetic shields to the circuit substrate and at the same time seals the microelectric module formed.

9 Claims, 1 Drawing Sheet

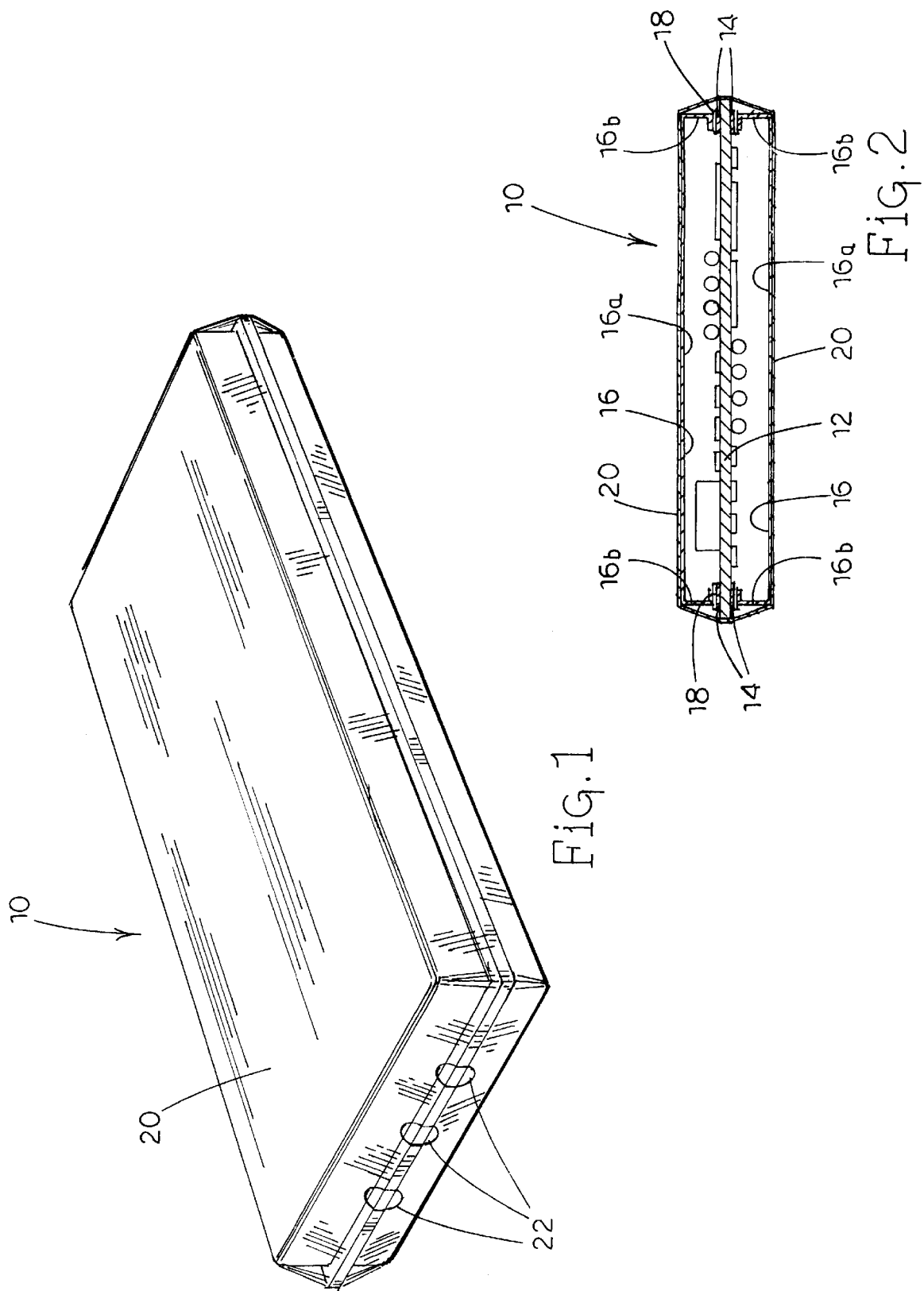

ELECTRIC MODULE STRUCTURE FORMED WITH A POLYMER SHRUNK MATERIAL

FIELD OF THE INVENTION

The present invention relates to electronic module structures, and more particularly to methods for securing covers, electromagnetic shields, and components to circuit substrates.

BACKGROUND OF THE INVENTION

In many types of electronic modules, it is critical that a cover or electromagnetic shield be placed over a section of electrical components that would typically be mounted on a printed circuit board. To secure covers or electromagnetic shields to circuit substrates, it is conventional to use solder, adhesive, and physical restraints such as fasteners, clamps, pins etc. While these methods have been widely used and have proven to be successful over the years, the use of solder, adhesive and fasteners in some applications are difficult to use, especially in rework or repair situations and in cases where the components being secured are very small. Further, solder requires the use of high temperatures for rework and repairs. Thus, during rework, care has to be taken to avoid disrupting components located near the rework site. Adhesives, on the other hand, may be cured by a variety of means, but generally require heat, solvents or mechanical assistance for rework. Finally, fasteners, clamps and the like are often impractical due to their size.

Therefore, there has been and continues to be a need for a method of automatically assembling electronic modules or components that utilizes a single material and process step to physically secure the components of the module together and which at the same time provides an assembled electronic module that lends itself to rework.

SUMMARY OF THE INVENTION

The present invention entails a microelectric module comprising a circuit substrate and at least one cover or electromagnetic shield disposed on the circuit substrate. To secure the cover or electromagnetic shield to the circuit substrate, a heat shrinkable polymer layer or film is extended over the cover or electromagnetic shield and the circuit substrate. The heat shrinkable polymer film or layer, after being heated and shrunk, exerts a downward pressure on the cover or electromagnetic shield, securing the cover or electromagnetic shield to the circuit substrate and at the same time maintaining an electrical contact between the cover or electromagnetic shield and a ground pattern formed on the circuit substrate.

In one embodiment of the present invention, the heat shrinkable polymer film or layer assumes the form of a tubular sleeve. The heat shrinkable polymer tubular sleeve is extended over and around at least one cover or electromagnetic shield and a circuit substrate. Thereafter, the polymer film is subjected to heat causing it to shrink inwardly around the module formed by the cover and circuit substrate. As the polymer film shrinks, this locks the cover or electromagnetic shield in place on the circuit substrate and provides a controlled force that results in continuous electrical contact of the covers or shields against a ground pattern on the circuit substrate.

Other objects and advantages of the present invention will become apparent and obvious from a study of the following description and the accompanying drawings which are merely illustrative of such invention.

BRIEF DESCRIPTION OF THE INVENTION

FIG. 1 is a perspective view of the electronic module of the present invention.

FIG. 2 is a transverse cross sectional view of the electronic module.

DETAILED DESCRIPTION OF THE INVENTION

With further reference to the drawings, the electronic module of the present invention is shown therein and indicated generally by the numeral 10. In the case of the embodiment illustrated herein, the electronic module 10 includes a circuit substrate 12 that is in the form of a printed circuit board. As seen in FIG. 2, the circuit substrate 12 includes an array of integrated electrical components. As used herein, the term circuit substrate means any base layer of an integrated circuit, hybrid, multi-chip module or circuit board. Such circuit substrates may be formed from a wide variety of materials, including semiconductors, ceramics, fiberglass, glass or diamond depending on the application.

Disposed on the circuit substrate 12 is one or more covers or electromagnetic shields 16. In the case of the embodiment illustrated herein, the circuit substrate includes opposite sides and there is provided a cover 16 disposed on each side thereof. It should be appreciated, however, that the electronic module 10 of the present invention may include only one cover or electromagnetic shield 16. In any event, each cover 16 includes a generally flat top 16a and a surrounding side wall structure 16b. The surrounding side wall structure 16b includes a terminal surrounding edge that directly or indirectly contacts a ground trace or ground pattern 14 formed on the circuit substrate 12. The contact between the cover 16 and the ground trace 14 may be through conventional ohmic contact or through more advanced metalized polymer shield gasket interfaces. In addition, the contact could simply be a metal to metal contact such as gold to gold. In lieu of direct metal to metal contact, a metalized polymer shield gasket, as noted above, could be interposed between the ground trace 14 and the terminal edge of the surrounding side wall 16b of the cover 16. In the case of the embodiment illustrated in FIG. 2, a conventional conductive thermoplastic material 18 is interposed between the terminal edge of the side wall 16b and the ground pattern 14 found on the circuit substrate 12.

To secure the cover or covers 16 to the circuit substrate 12, there is provided a heat shrunk polymer layer or film 20 that extends over and around the covers 16 and effectively physically secures the covers 16 to the circuit substrate 12 such that electrical contact is maintained between the covers 16 and the adjacent ground pattern 14 on the circuit substrate 12.

The polymer layer or film 20 would typically be constructed of polyvinyldene fluoride (PVF). The polymer layer or film can take various forms. However, in the embodiment illustrated herein, the heat shrinkable polymer film 20 assumes the form of a tubular sleeve. Typically, the tubular sleeve or polymer film 20 would be appropriately sized for diameter and circumference and cut into selected links. Normally the tubular polymer sleeves are extracted and fully polymerized. Thereafter, the polymer sleeve or film is physically stretched. Thereafter, in an automated or manual process, the tubular sleeves of the polymer film would be pulled over a circuit substrate 12 and the cover or covers 16 thereon. Thereafter, heat would be applied to the tubular sleeve of polymer film causing it to shrink inwardly around the covers 16 and the substrate 12. It should be noted that the PVF material will withstand temperatures of solder reflow on the order of 250° C. This allows conventional soldering processes to be carried out and completed simultaneously with heat shrinking the polymer film 20. The heating of the plastic tubular sleeve can be carried out in a number of ways. For example, the electronic module 10 having the polymer tubular sleeve 20 thereon can be conveyed through a heat tunnel where the tubular sleeve would be subjected to a system of hot air. As the tubular sleeve is subjected to heat, it will, of course, shrink around the covers 16 and effectively apply a controlled force against the cover 16 that will physically secure the cover or covers to the circuit substrate 12 and at the same time will maintain electrical contact between the covers 16 and the ground trace or pattern 14 formed on the circuit substrate 12.

After the polymer layer or film has been heat shrunk around the electric module, the nature of the polymer film in a shrunken state results in a continuing and residual force being applied against the covers 16 that again contributes to an electronic module structure where the components are securely contained and where electrical contact is maintained between the covers 16 and the ground trace or pattern 14 of the circuit substrate 12.

The polymer layer or film 20 can be provided with one or more access openings 22. Openings 22 can be punched in the polymer layer or film after it has been heat shrunk around the electronic module 10. Further, it is contemplated, that the openings 22 can be prepunched or preformed in the polymer layer or film 20 prior to being extended around the components that form the electronic module 10. In any event, one or more openings 22 would accommodate wire leads that may be required to be extended from the electronic module 10 or would permit access to reconfigure components or switches disposed on the circuit substrate 12. In addition, openings 22 may in some cases provide appropriate ventilation for components disposed on the circuit substrate 12.

One main advantage of the electronic module structure 10 of the present invention, is that the construction of the module and particularly the use of the heat shrunk polymer film, makes rework and repair relatively easy. To rework or repair the electronic module of the present invention simply requires that the polymer film 20 be cut and removed from the covers 16 and circuit substrate 12. Once repair or rework has been completed, then the cover or covers 16 can be resecured about the circuit substrate 12 by heat shrinking another polymer layer or film around the same. Thus, it is appreciated, that personnel performing such repairs are not required to deal with solder, adhesive, fasteners or clamps that might be used to secure the cover 16 to the circuit substrate.

From the foregoing specification and discussion, it is appreciated that the present invention provides a microelectric module structure that utilizes a heat shrinkable polymer to secure components such as a cover or electromagnetic shield to a circuit substrate. When the heat shrinkable polymer is subject to heat, the material shrinks and this locks the underlying assembly components into place and provides a controlled force that acts to urge the cover or covers into electrical contact with ground patterns on the circuit substrate. The heat shrunk polymer provides sufficient pressure to maintain electrical contact between the ground pattern and the cover or covers being secured to the circuit substrate.

The present invention may, of course, be carried out in other specific ways than those herein set forth without departing from the spirit and the essential characteristics of the invention. The present embodiments are therefore to be construed in all aspects as illustrative and not restrictive and all changes coming within the meaning and equivalency range of the appended claims are intended to be embraced therein.

What is claimed is:

1. An electric module comprising:

a circuit substrate comprising a ground plane;

a electromagnetically shielding cover contacting said substrate and electrically connected to said ground plane;

the cover including a top and a surrounding sidewall structure with the top being spaced and supported above the circuit substrate by the surrounding sidewall structure; and a heat shrunk polymer layer extending over the cover and the circuit substrate for securing the cover to the substrate, and for securing the cover in electrical contact to the ground plane of the circuit substrate.

2. The electric module of claim 1 wherein the surrounding side wall structure includes a terminal edge that lies in contact with the ground plane on the circuit substrate.

3. The electric module of claim 2 wherein the heat shrunk polymer layer holds the cover in place on the circuit substrate and provides a control force against the cover; and wherein the control force exerted by the heat shrunk polymer layer permits ohmic contact between the terminal edge of the surrounding side wall structure and the ground plane disposed on the circuit substrate.

4. The electric module of claim 1 wherein the module includes at least one cover disposed on each side of the circuit substrate and wherein the polymer layer covers and extends around both the covers and the circuit substrate so as to secure each of the covers to the substrate such that each of the covers is maintained in electrical contact with the ground plane of the circuit substrate.

5. The electric module of claim 1 including a conductive thermal plastic interface disposed between the surrounding side wall structure of the cover and the circuit substrate.

6. The electric module of claim 1 wherein the heat shrunk polymer layer includes at least one opening for gaining access to an area internally of the heat shrunk polymer layer.

7. The electric module of claim 1 including a metallized polymer composition dispersed between the surrounding side wall structure of the cover and the ground plane disposed on the circuit substrate, and wherein the heat shrunk polymer layer exerts a control force on the cover that permits electrical contact to be achieved between the cover and the ground plane of the circuit substrate.

8. The electric module of claim 1 wherein the surrounding side wall structure includes at least four sides that extend from the top at generally right angles to the top.

9. The electric module of claim 1 wherein the electromagnetic shielding cover is placed directly adjacent the circuit substrate without any intermediary layer being interposed between the cover and the circuit substrate.

* * * * *